United States Patent [19]
Liang et al.

[11] Patent Number: 6,071,783
[45] Date of Patent: Jun. 6, 2000

[54] PSEUDO SILICON ON INSULATOR MOSFET DEVICE

[75] Inventors: Mong-Song Liang; Jin-Yuan Lee; Chue-San Yoo, all of Hsin-chu, Taiwan

[73] Assignee: Taiwan Semiconductor Manufacturing Company, Hsin-Chu, Taiwan

[21] Appl. No.: 09/133,353

[22] Filed: Aug. 13, 1998

[51] Int. Cl.[7] .................................................. H01L 21/336
[52] U.S. Cl. .......................... 438/301; 438/300; 438/305; 438/264
[58] Field of Search .................................... 438/300, 305, 438/264, 424, 291, 301, 282, 289, 302

[56] References Cited

U.S. PATENT DOCUMENTS

| | | | |
|---|---|---|---|
| 5,296,392 | 3/1994 | Grula et al. | 437/34 |
| 5,575,885 | 11/1996 | Hirabayashi et al. | 437/228 |
| 5,610,083 | 3/1997 | Chan et al. | 437/21 |
| 5,691,231 | 11/1997 | Kobayashi et al. | 437/62 |
| 5,786,229 | 7/1998 | Park | 437/67 |
| 5,872,043 | 2/1999 | Chen | 438/424 |
| 5,943,575 | 8/1999 | Chung | 438/300 |

*Primary Examiner*—John F. Niebling
*Assistant Examiner*—Walter L. Lindsay, Jr.
*Attorney, Agent, or Firm*—George O. Saile; Stephen B. Ackerman

[57] ABSTRACT

A process for forming a MOSFET device, featuring a heavily doped source/drain region, isolated from a semiconductor substrate, via use of a thin silicon oxide layer, has been developed. After formation of a lightly doped source/drain region, an opening is created in the semiconductor substrate, in a region between insulator spacers, on a gate structure, and insulator filled, shallow trench regions, resulting in lightly doped source/drain segments, remaining under the masking insulator spacers. After a thin silicon oxide layer is formed on the exposed silicon surfaces, in the openings, a silicon deposition, and etch back procedures are performed, partially refilling the openings to a depth that still allows the thin silicon oxide layer to be exposed on the sides of the lightly doped source/drain segment. After removal of the exposed portion of the thin silicon oxide layer, and after deposition and etch back of another silicon layer, completely filling the openings, a heavily doped source/drain region is formed in the silicon layers, residing in the openings.

27 Claims, 3 Drawing Sheets

PSEUDO SILICON ON INSULATOR MOSFET DEVICE

BACKGROUND OF THE INVENTION (1) Field of the Invention

The present invention relates to methods used to fabricate semiconductor devices, and more specifically to a method used to fabricate a metal oxide semiconductor field effect transistor, (MOSFET), device, in which the source/drain region of the MOSFET device, is isolated from the semiconductor substrate, by a thin silicon oxide layer.

(2) Description of the Prior Art

The semiconductor industry is continually striving to improve the performance of devices, via use of micro-miniaturization, or the use of sub-micron features. The objective of micro-miniaturization has been successfully addressed via advances in specific semiconductor fabrication disciplines, such as photolithography and dry etching. The use of more sophisticated exposure cameras, as well as the use more sensitive photoresist masking materials, have allowed sub-micron images to be routinely achieved in masking photoresist layers. In addition the development of advanced dry etching tools, and procedures, have allowed the sub-micron images in photoresist masking layers, to be successfully transferred to underlying materials, used for the fabrication of sub-micron MOSFET devices. These sub-micron, MOSFET features, such as the sub-micron channel length, located under narrow gate structures, between source/drain regions, allow increased MOSFET performance to be achieved. In addition the smaller MOSFET features, achieved via fabrication enhancements, result in capacitance decreases, such as a decreased source/drain to substrate capacitance, achieved via smaller source/drain features, thus also resulting in improvement of MOSFET device performance.

In addition to MOSFET performance enhancements, achieved via micro-miniaturization, and the accompanying reductions in performance degrading capacitance, additional capacitance decreases, or performance enhancements can be achieved via structural enhancements. The use of a silicon on insulator, (SOI), technology, allowing the MOSFET device to be fabricated on a SOI layer results in capacitance decreases between the semiconductor substrate, and overlying, interfacing regions of the MOSFET device. For example Chan et al. in U.S. Pat. No. 5,610,083, teach a procedure for fabricating a MOSFET device on a SOI layer, and thus achieve performance enhancements, when compared to counterparts, where the MOSFET device was formed directly on a semiconductor substrate. However the use of special semiconductor substrates, needed for the SOI technology, is expensive, and although performance objectives may be satisfied using a SOI wafer, the as important cost objectives, are not satisfied.

This invention will describe a procedure for obtaining a MOSFET in which an insulator layer is formed only between heavily doped source/drain regions and the semiconductor substrate. The use of this insulator layer, or the pseudo SOI layer, results in capacitance reductions, performance enhancements, via removal of the source/drain to substrate interface, while maintaining cost, via use of a conventional semiconductor substrate.

SUMMARY OF THE INVENTION

It is an object of this invention to improve the performance of a MOSFET device, by minimizing junction capacitance.

It is another object of this invention to fabricate a MOSFET device, using a thin insulator layer only between heavily doped/source drain regions, and the semiconductor substrate.

In accordance with the present invention a method for fabricating a MOSFET device, using an insulator layer between a heavily doped source/drain region, and the semiconductor substrate, used to decrease junction capacitance, is described. A gate insulator layer is thermally grown on regions of a semiconductor substrate, between isolation regions. A polysilicon gate structure, with an overlying insulator hard mask, is formed on the gate insulator layer. A lightly doped source/drain is formed in the region of the semiconductor substrate, not covered by the polysilicon gate structure, followed by the creation of insulator spacers, on the sides of the polysilicon gate structure. An anisotropic, reactive ion etching, (RIE), procedure is employed to remove regions of the semiconductor substrate, not covered by the polysilicon gate structure, not covered by the insulator spacers, and not covered by the isolation regions, resulting in openings in the semiconductor substrate, between the insulator spacers, on the polysilicon gate structure, and the isolation regions, and also resulting in a segment of the lightly doped source and drain region, underlying the insulator spacer. A thin insulator layer is next thermally grown on the exposed surfaces of the opening in the semiconductor substrate. A first silicon deposition, and etch back, is performed to refill the opening in the semiconductor substrate, to a level approximately equal to the bottom of the lightly doped source/drain segment. The thin insulator layer, on the sides of the lightly doped source/drain segment is next removed, followed by a second silicon deposition, and etch back, completely filling the opening in the semiconductor substrate. A heavily doped source/drain region is then formed in the silicon fill, in the opening in the semiconductor substrate, with the heavily doped source/drain region interfacing the region of the lightly doped source/drain segment, located under the insulator spacer, and with the reemainder of the heavily doped source/drain region residing on the thin insulator layer, in the region in which the thin insulator layer overlays the sides of the opening in the semiconductor substrate.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

A method for fabricating a MOSFET device, using a thin insulator between a heavily doped source/drain region, and the semiconductor substrate, will now be described in detail. The MOSFET device used in this invention, is an N channel, or NFET device, however this invention can be applied to P channel, (PFET), devices, or to complimentary, (CMOS), device, comprised of both NFET and PFET devices.

Figure 1:
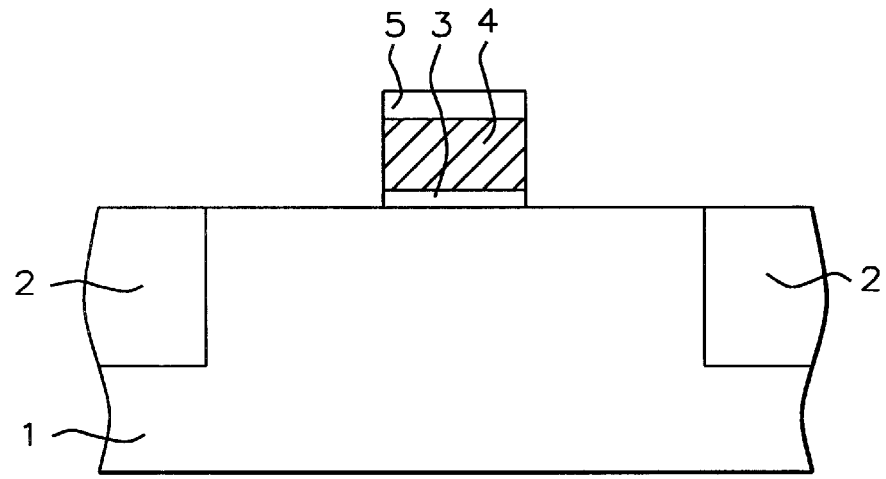
FIGS. 1–8, which schematically, in cross-sectional style, describe the key stages of fabrication, used to create a MOSFET device, using a pseudo SOI approach, or a thin insulator layer between source/drain and substrate, for junction capacitance optimization.

A P type, single crystalline, silicon substrate 1, with a <100> crystallographic orientation, is used, and shown schematically in FIG. 1. Shallow trench isolation, (STI), regions 2, are formed in the semiconductor substrate, for purposes of isolation. Briefly, STI regions 2, are formed by initially creating a shallow trench, to a depth in semiconductor substrate 1, between about 2000 to 5000 Angstroms, via photolithographic and anisotropic RIE procedures, using $Cl_2$ as an etchant. After removal of the photoresist shape, used for definition of the shallow trench, via plasma oxygen ashing and careful wet cleans, a silicon oxide layer is deposited via low pressure chemical vapor deposition, (LPCVD), or plasma enhanced chemical vapor deposition, (PECVD), procedures, completely filling the shallow trench. Removal of regions of the silicon oxide layer, overlying semiconductor substrate 1, are removed using anisotropic RIE procedure, using $CHF_3$ as an etchant, resulting in STI regions 2, shown schematically in FIG. 1. A chemical mechanical polishing, (CMP), procedure can be used in place of the anisotropic RIE procedure, to remove unwanted regions of the silicon oxide layer, also field oxide, (FOX), regions, created via thermal oxidation procedures, can be used in place of STI regions, if desired.

A gate insulator layer 3, comprised of silicon dioxide, is next formed via thermal oxidation in an oxygen-steam ambient, to a thickness between about 25 to 100 Angstroms. A polysilicon layer 4, is next deposited using LPCVD procedures, to a thickness between about 1000 to 3000 Angstroms, using silane as a source. Polysilicon layer 4, can be doped in situ, during deposition, via the addition of arsine, or phosphine, to the silane ambient, or polysilicon layer 4, can be deposited intrinsically, then doped via ion implantation procedures, using arsenic or phosphorous ions. In addition, if lower resistance is needed, polysilicon layer 4, can be replaced by a polycide, (metal silicide-polysilicon layer), via deposition of a metal silicide layer, such as tungsten silicide, on an underlying polysilicon layer. Finally insulator layer 5, comprised of either silicon oxide, or silicon nitride, is deposited using either LPCVD, or PECVD procedures, to a thickness between about 200 to 2500 Angstroms. Conventional photolithographic and RIE, procedures, using $CHF_3$ as an etchant for silicon oxide layer 5, ($CHF_3$ would also be used as an etchant if insulator layer 5, is silicon nitride), and $Cl_2$ as an etchant for polysilicon layer 4, are used to produce polysilicon gate structure 4, capped with insulator layer 5. Removal of the photoresist shape, used for definition of polysilicon gate structure 4, schematically shown in FIG. 1, is accomplished via plasma oxygen ashing and careful wet cleans.

Figure 2:
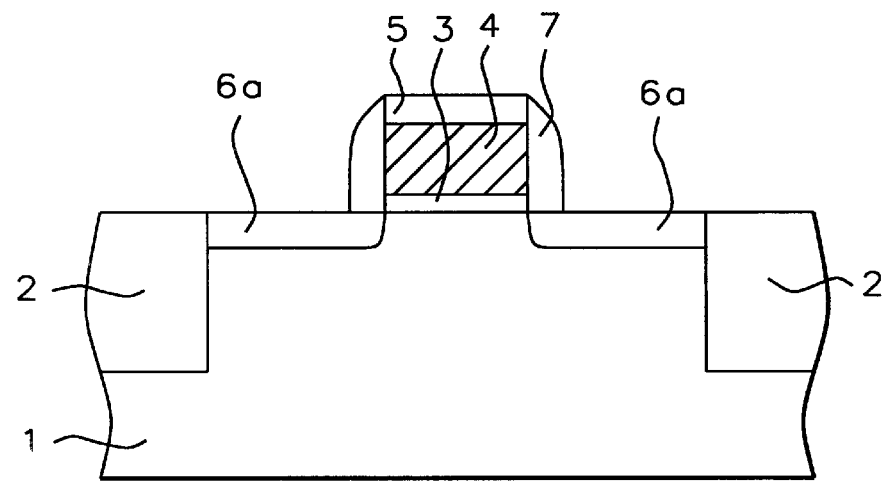

A lightly doped source/drain region 6a, is next created via ion implantation of phosphorous or arsenic, at an energy between about 5 to 30 KeV, at a dose between about 1E13 to 5E14 atoms/$cm^2$, in a region of semiconductor substrate 1, not covered by polysilicon gate structure 4. Next an insulator layer 7, comprised of silicon nitride, is deposited, again via use of either LPCVD or PECVD procedures, to a thickness between about 500 to 2000 Angstroms. Insulator layer 7, can be a silicon oxide layer, if desired, also obtained using LPCVD or PECVD procedures. An anisotropic RIE procedure, using $CHF_3$ as an etchant for silicon nitride, (also using $CHF_3$ as an etchant for silicon oxide), is used to create insulator spacers 7, on polysilicon gate structures 4. This is schematically shown in FIG. 2. A segment of lightly doped source/drain region 6a, now resides under insulator spacer 7.

Figure 3:
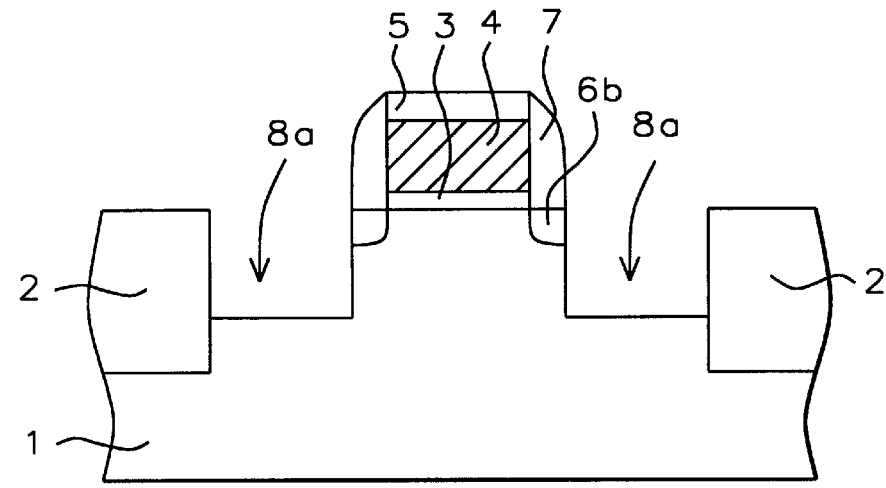
Figure 4:
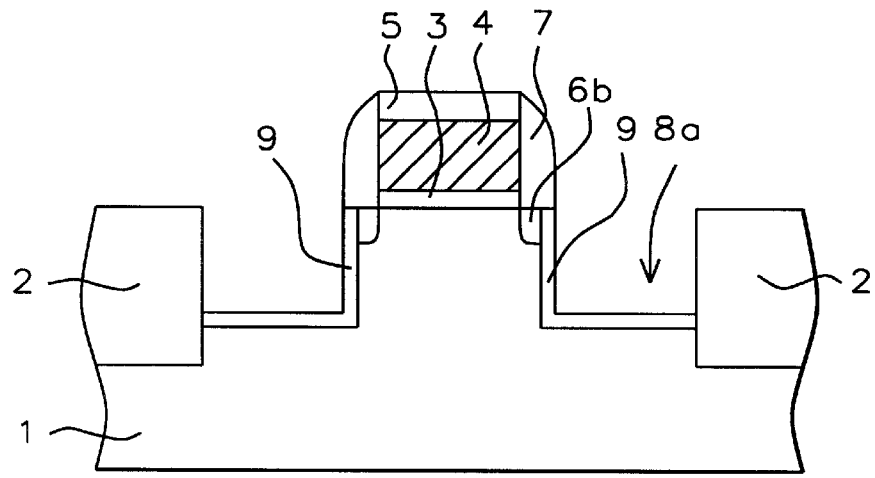

FIG. 3, shows the result of removing the region of semiconductor substrate 1, located between insulator spacers 7, on the sides of polysilicon gate structure 4, and STI regions 2, accomplished via a selective, anisotropic RIE procedure, using $CL_2$ as an etchant. The use of $Cl_2$ as an etchant, allows semiconductor substrate 1, to be removed, while exposed insulator layer 5, insulator spacers 7, and STI regions 2, are not attacked. This procedure, creating opening 8a, with a depth between about 1000 to 3000 Angstroms, below the top surface of semiconductor substrate 1, removes exposed regions of lightly doped source/drain region 6a, resulting in lightly doped source/drain segment 6b, protected by insulator spacers 7, during the creation of opening 8a. A silicon dioxide layer 9, is next grown, to a thickness between about 40 to 500 Angstroms, via the thermal oxidation of the exposed surfaces of opening 8, in an oxygen-steam ambient. Silicon oxide layer 9, is formed on the surfaces of semiconductor substrate 1, and the surface of lightly doped source/drain segment 6b, exposed in opening 8a. The formation of silicon oxide layer 9, on the exposed side of lightly doped source/drain segment 6b, resulted in the edge of lightly doped source/drain segment 6b, to now be located under insulator spacer 7. This is shown schematically in FIG. 4.

Figure 5:
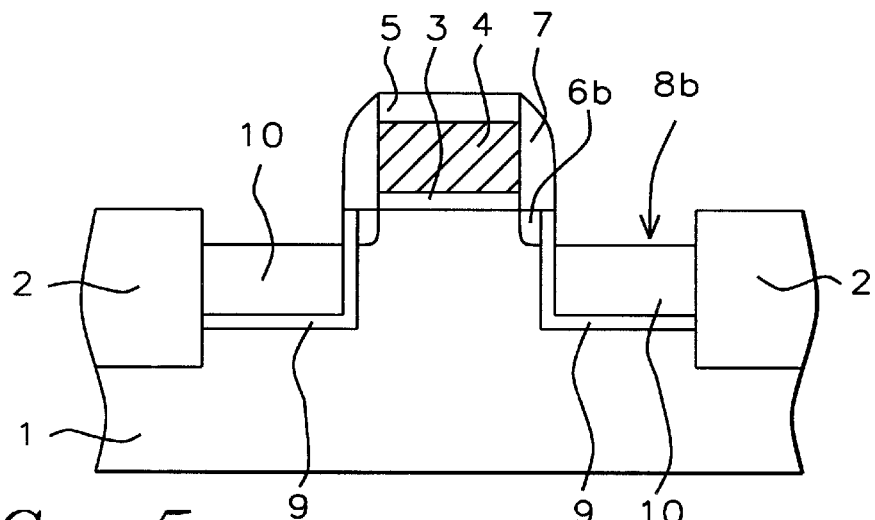
Figure 6:
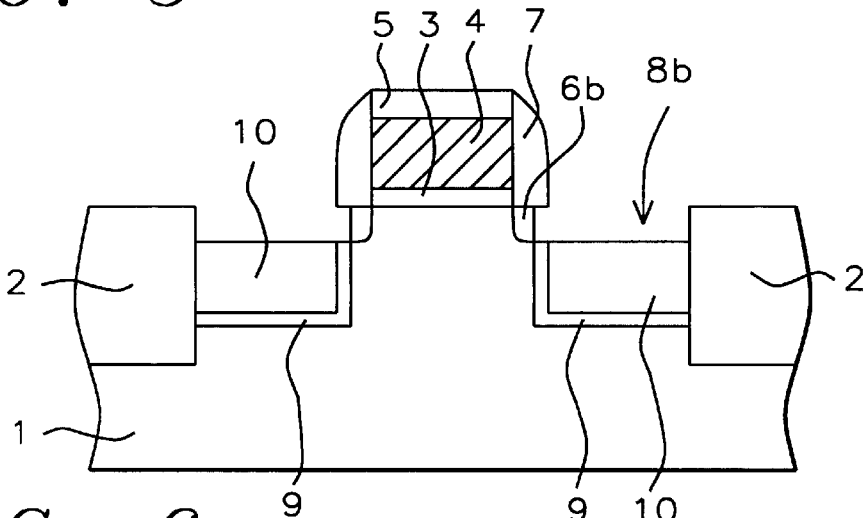

A first deposition of an intrinsic silicon layer 10, comprised of either polysilicon or amorphous silicon, is next performed via LPCVD procedures, to a thickness between about 1000 to 6000 Angstroms, completely filling opening 8a. If desired, an amorphous silicon layer can be deposited, then annealed, to convert the amorphous silicon layer to a single crystalline silicon layer. A first chemical mechanical polishing, (CMP), procedure is used to polish silicon layer 10, followed by a first, selective anisotropic RIE procedure, using $Cl_2$ as an etchant, is used to etch back the silicon layer 10, to a depth in which the top surface of silicon layer 10, is between about 300 to 1500 Angstroms below the top surface of semiconductor substrate 1, exposing the portion of silicon oxide layer 9, which resides on the side of lightly doped source/drain segment 6b, and creating opening 8b. This is schematically shown in FIG. 5. A isotropic wet etch, using a buffered hydrofluoric acid solution, or a dilute hydrofluoric acid solution, is used to remove the exposed portion of silicon oxide layer 9, exposed in opening 8b, resulting in the exposure of the side of lightly doped source/drain segment 6b. This is schematically shown in FIG. 6.

Figure 7:
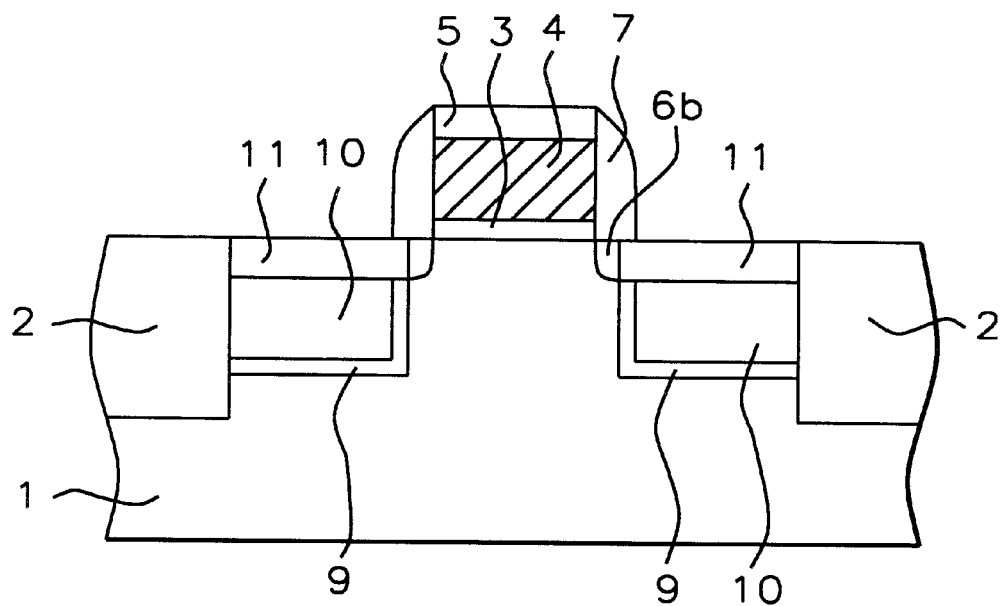
Figure 8:
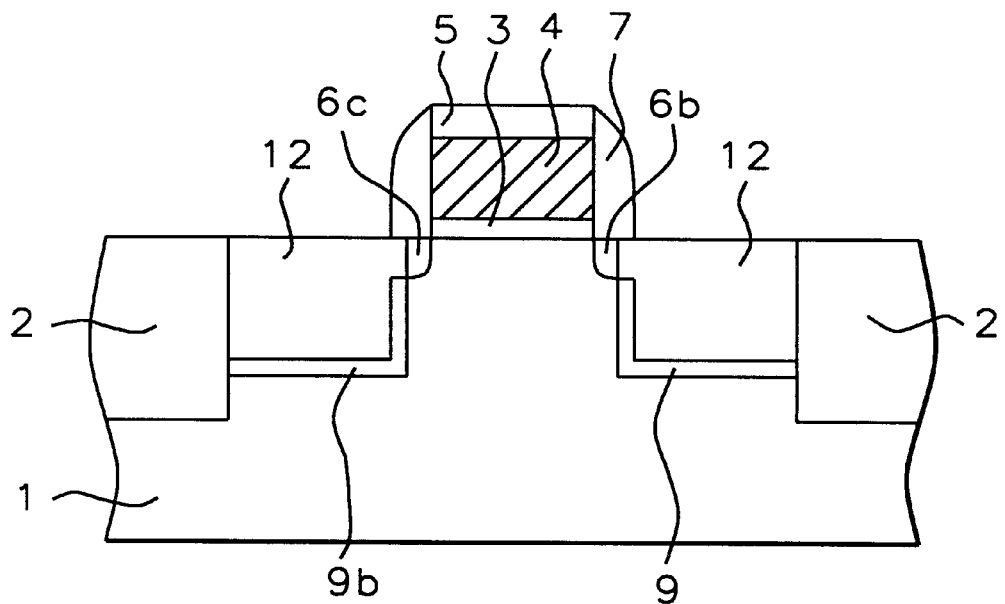

A second deposition of an intrinsic silicon layer 11, is performed using LPCVD procedures, to a thickness between about 1000 to 6000 Angstroms, completely filling opening 8b. Silicon layer 11, can either be a polysilicon layer, a amorphous silicon layer, or a amorphous or polysilicon layer, subjected to an anneal procedure to create a single crystalline silicon layer. A second CMP procedure, followed by a second, selective anisotropic RIE procedure, using $Cl_2$ as an etchant, is used to etch back silicon layer 11, to a depth in which the top surface of silicon layer 11, is at the same level as the top surface semiconductor substrate 1. In addition silicon layer 11, interfaces the side of lightly doped source/drain segment 6b, in the region directly underlying insulator spacer 7. This is schematically shown in FIG. 7. Finally a ion implantation procedure is performed, using phosphorous or arsenic ions, at an energy between about 10 to 50 KeV, at a dose between about 1E15 to 1E16 atoms/$cm^2$, followed by an anneal procedure, at a temperature between about 700 to 1100° C., creating heavily doped source/drain region 12, in silicon layer 10, and silicon layer 11. Heavily doped source/drain region 12, shown schematically in FIG. 8, is isolated from semiconductor substrate 1, via silicon oxide layer 9, and thus offers less junction capacitance, and increased performance, compared to counterparts fabricated using heavily doped source/drain regions in direct contact with the semiconductor substrate. The only region in which the heavily doped source/drain region 12, is not isolated by silicon oxide layer 9, is where contact to lightly doped source drain segment 6b, occurs. Thus the process for creating a pseudo MOSFET device, using a thin silicon oxide layer, to reduce junction capacitance arising at the interfaces of MOSFET regions, can be used as an inexpensive alternative to creating MOSFET devices in a SOI layer.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a MOSFET device, on a semiconductor substrate, comprising the steps of:

forming isolation regions in said semiconductor substrate;

forming a gate insulator layer on said semiconductor substrate;

forming an insulator capped, gate structure on said gate insulator layer;

forming a lightly doped source/drain region, in regions of said semiconductor substrate, not covered by said insulator capped, gate structure, and not covered by said isolation regions;

forming an insulator spacer on the sides of said insulator capped, gate structure;

forming first openings in a region of said semiconductor substrate, between insulator spacers, on the side of said insulator capped, gate structure, and said isolation region, removing the portion of said lightly doped source and drain region, exposed between insulator spacers, on the sides of said insulator capped, gate structure, and isolation regions, and leaving lightly doped source/drain segments, under said insulator spacers;

growing a thin insulator layer on the exposed surfaces of said first openings, including the growth of said thin insulator layer on the exposed side of said lightly doped source/drain segments;

partial filling of said first openings, with a first silicon layer, on said thin insulator layer, in said first openings, creating second openings, located between said insulator spacers, on the sides of said gate structure, and said isolation regions, with said second openings exposing a portion of said thin insulator layer, located on the side of said lightly doped source/drain segments;

removing said portion of said thin insulator layer, from the side of said lightly doped source/drain segments, in said second openings;

complete filling of said second openings, with a second silicon layer, and with said second silicon layer interfacing the side of said lightly doped source/drain segments, in said second opening; and forming heavily doped source/drain regions in said second silicon layer, and in said first silicon layer, with said heavily doped source/drain regions, interfacing the side of said lightly doped source/drain segments, in a region underlying said insulator spacers, and with said heavily doped source/drain region interfacing, and overlying, said thin insulator layer.

2. The method of claim 1, wherein said isolation regions, are insulator filled shallow trench regions, formed to a depth between about 2000 to 5000 Angstroms, in said semiconductor substrate, and filled with silicon oxide.

3. The method of claim 1, wherein said gate insulator layer is silicon dioxide, obtained via thermal oxidation, in an oxygen-steam ambient, at a thickness between about 25 to 100 Angstroms.

4. The method of claim 1, wherein said insulator capped, gate structure is a polysilicon gate structure, formed from a polysilicon layer, obtained via LPCVD procedures, at a thickness between about 1000 to 3000 Angstroms.

5. The method of claim 1, wherein the insulator layer, used for said insulator capped, gate structure, is a silicon oxide layer, obtained via LPCVD or PECVD procedures, at a thickness between about 200 to 2500 Angstroms.

6. The method of claim 1, wherein the insulator layer, used for said insulator capped, gate structure, is a silicon nitride layer, obtained via LPCVD or PECVD procedures, at a thickness between about 200 to 2500 Angstroms.

7. The method of claim 1, wherein said lightly doped source/drain region is created via ion implantation of arsenic or phosphorous ions, at a energy between about 5 to 30 KeV, at a dose between about 1E13 to 5E14 atoms/cm$^2$.

8. The method of claim 1, wherein said insulator spacers are formed from a silicon oxide layer, obtained using LPCVD or PECVD procedures, at a thickness between about 500 to 2000 Angstroms.

9. The method of claim 1, wherein said insulator spacers are formed from a silicon nitride layer, obtained from a LPCVD or PECVD procedure, at a thickness between about 500 to 2000 Angstroms.

10. The method of claim 1, wherein said first openings are formed to a depth between about 1000 to 3000 Angstroms, below the top surface of said semiconductor substrate, via an anisotropic RIE procedure, using $Cl_2$ as an etchant.

11. The method of claim 1, wherein said thin insulator layer, on the surface of said first openings, is a silicon dioxide layer, obtained via thermal oxidation procedures, in an oxygen-steam ambient, to a thickness between about 40 to 50 Angstroms.

12. The method of claim 1, wherein said first silicon layer, used to partially fill said first openings, is a polysilicon layer, or an amorphous silicon layer, obtained via LPCVD procedures, to a thickness between about 1000 to 6000 Angstroms.

13. The method of claim 1, wherein said partial filling of said first openings, is accomplished via deposition of said first silicon layer, and an anisotropic RIE, etch back procedure, using $Cl_2$ as an etchant for said first silicon layer, creating said second opening, with a depth between about 300 to 1500 Angstroms, below the top surface of said semiconductor substrate.

14. The method of claim 1, wherein the portion of said thin insulator layer, exposed in said second opening, located on the side of said lightly doped source/drain segment, is removed using a buffered hydrofluoric acid, or a dilute hydrofluoric acid, solution.

15. The method of claim 1, wherein said second silicon layer, used to fill said second openings, is a polysilicon layer, or an amorphous silicon layer, obtained via LPCVD procedures, at a thickness between about 1000 to 6000 Angstroms.

16. The method of claim 1, wherein said heavily doped source/drain region is created via ion implantation of arsenic or phosphorous ions, at an energy between about 10 to 50 KeV, at a dose between about 1E15 to 1E16 atoms/cm$^2$.

17. A method of fabricating a MOSFET device, on a semiconductor substrate, using a thin silicon oxide layer to isolate a heavily doped source/drain region, from said semiconductor substrate, comprising the steps of:

forming isolation regions in said semiconductor substrate;

forming a silicon dioxide gate insulator layer on said semiconductor substrate;

forming a silicon oxide capped, polysilicon gate structure, on said silicon dioxide gate insulator layer;

forming a lightly doped source/drain region, in a region of said semiconductor substrate, not covered by said silicon oxide capped, polysilicon gate structure, or by said isolation regions;

forming silicon oxide spacers on the sides of said silicon oxide capped, polysilicon gate structure;

anisotropic etching of a region of said lightly doped source/drain region, and of an underlying portion of said semiconductor substrate, exposed between said silicon oxide spacers, and said isolation region, to create first openings in said semiconductor substrate, leaving lightly doped source/drain segments under said silicon oxide spacers;

growing said thin silicon oxide layer on the exposed surfaces of said first opening;

depositing a first intrinsic silicon layer, completely filling said first openings;

etching of said first intrinsic silicon layer, to a level in which first silicon layer remains in the bottom portion of said first openings, resulting in second openings, located between said silicon oxide spacers, and said isolation regions, with said thin silicon oxide layer, on sides of said lightly doped source/drain segments, exposed in said second openings;

removing said thin silicon oxide layer, from the sides of said lightly doped source/drain segments, exposed in said second openings;

depositing a second intrinsic silicon layer, completely filling said second opening;

etching of said second intrinsic silicon layer, to a level in which said second silicon layer is planar with the top surface of said semiconductor substrate; and forming said heavily doped source/drain regions, in said second intrinsic silicon layer, and in said first intrinsic silicon layer, with said heavily doped source/drain regions overlying said thin silicon oxide layer, in said first openings, and with said heavily doped source/drain regions, interfacing the sides of said lightly doped source/drain segments, in regions of said second openings in which said thin silicon oxide layer has been removed.

18. The method of claim 17, wherein said isolation regions are silicon oxide filled, shallow trench regions, formed to a depth between about 2000 to 5000 Angstroms, below the top surface of said semiconductor substrate.

19. The method of claim 17, wherein said silicon dioxide gate insulator layer is thermally grown, in an oxygen-steam ambient, to a thickness between about 25 to 100 Angstroms.

20. The method of claim 17, wherein said silicon oxide spacers, on the sides of said silicon oxide capped, polysilicon gate structure, are formed via deposition of a silicon oxide layer, via LPCVD or PECVD procedures, at a thickness between about 500 to 2000 Angstroms, followed by an anisotropic RIE procedure, using $CHF_3$ as an etchant.

21. The method of claim 17, wherein said lightly doped source/drain regions are formed via ion implantation of arsenic or phosphorous ions, at an energy between about 5 to 30 KeV, at a dose between about 1E13 to 5E14 atoms/$cm^2$.

22. The method of claim 17, wherein said first openings are created via an anisotropic RIE procedure, using $Cl_2$ as an etchant, to a depth between about 1000 to 3000 Angstroms, below the top surface of said semiconductor substrate.

23. The method of claim 17, wherein said thin silicon oxide layer is thermally grown on the exposed surfaces of said first openings, in a oxygen-steam ambient, to a thickness between about 40 to 500 Angstroms.

24. The method of claim 17, wherein said first intrinsic silicon layer, is an intrinsic polysilicon layer, or an intrinsic amorphous silicon layer, deposited using LPCVD procedures, at a thickness between about 1000 to 6000 Angstroms.

25. The method of claim 17, wherein said thin silicon oxide layer, on the sides of said lightly doped source/drain segment, exposed in said second openings, is removed using a buffered hydrofluoric acid, or a dilute hydrofluoric acid solution.

26. The method of claim 17, wherein said second intrinsic silicon layer is an intrinsic polysilicon layer, or an intrinsic amorphous silicon layer, deposited using LPCVD procedures, to a thickness between about 1000 to 6000 Angstroms.

27. The method of claim 17, wherein said heavily doped source/drain regions are formed in said second intrinsic silicon layer, and in said first intrinsic silicon layer, via ion implantation of arsenic, or phosphorous ions, at an energy between about 10 to 50 KeV, at a dose between about 1E15 to 1E16 atoms/$cm^2$.

* * * * *